(12) United States Patent
Kwon et al.

(10) Patent No.: US 8,378,440 B2
(45) Date of Patent: Feb. 19, 2013

(54) BACK-LIT IMAGE SENSOR AND METHOD OF MANUFACTURE

(75) Inventors: Doo-Won Kwon, Seongnam-si (KR); Chang-Rok Moon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 25 days.

(21) Appl. No.: 12/648,381

(22) Filed: Dec. 29, 2009

(65) Prior Publication Data

US 2010/0176474 A1 Jul. 15, 2010

(30) Foreign Application Priority Data

Jan. 14, 2009 (KR) .................. 10-2009-0003100

(51) Int. Cl.
*H01L 31/0232* (2006.01)
(52) U.S. Cl. ................... 257/432; 257/E31.127
(58) Field of Classification Search .................. 257/432, 257/E31.127
See application file for complete search history.

(56) References Cited

U.S. PATENT DOCUMENTS

| 7,511,257 | B2 * | 3/2009 | Lee et al. | 250/214.1 |
| 7,579,637 | B2 * | 8/2009 | Nam et al. | 257/292 |
| 2008/0036024 | A1 * | 2/2008 | Hwang et al. | 257/432 |
| 2008/0157247 | A1 * | 7/2008 | Yun | 257/432 |

* cited by examiner

*Primary Examiner* — Matthew W Such
*Assistant Examiner* — Monica D Harrison
(74) *Attorney, Agent, or Firm* — Volentine & Whitt, PLLC

(57) ABSTRACT

A backside-illuminated image sensor includes photoelectric converters disposed in a front-side of a substrate and arranged to define pixels, back-side interlayer dielectric patterns disposed on the back-side of the substrate over the photoelectric converters, color filters arranged over the back-side interlayer dielectric patterns, and micro-lenses arranged over the color filters, wherein adjacent back-side interlayer dielectric patterns are separated by an intervening gap region having a refractive index less than that of the back-side interlayer dielectric patterns.

17 Claims, 13 Drawing Sheets

BACK-LIT IMAGE SENSOR AND METHOD OF MANUFACTURE

CROSS-REFERENCE TO RELATED APPLICATION

This U.S. nonprovisional patent application claims priority under 35 U.S.C. §119 to Korean Patent Application 10-2009-0003100 filed on Jan. 14, 2009, the subject matter of which is hereby incorporated by reference.

BACKGROUND

The present inventive concept relates to image sensors and methods of manufacturing same. More particularly, the inventive concept relates to backside-illuminated image sensors and related methods of manufacture.

In common conventional methods of manufacture for image sensors (e.g., CMOS image sensors), transistors are formed on a semiconductor substrate on which photodiodes have been formed for each image sensor pixel. Multi-layered metal interconnects and interlayer dielectrics are then formed on the transistors. Finally, color filters and micro-lenses are formed on the interlayer dielectric.

Image sensors having a structure consistent with this conventional manufacturing approach require light focused by a micro-lens to pass through a number of different interlayer dielectric layers before reaching a photodiode. This optical pathway tends to incorporate a great deal of reflection and suffers from optical shielding as a result of the multi-layered metal interconnects. As a result, light collection ratio at the photodiode is relatively low, and image quality suffers.

Such problems are mitigated to a certain degree in so-called backside-illuminated image sensors. Backside-illuminated image sensors provide an optical pathway for photo-diode-incident light through the back-side of a constituent substrate, wherein the opposing front-side of the substrate is conventionally used to accommodate the afore-mentioned metal interconnects and interlayer dielectrics. Unfortunately, conventional backside-illuminated image sensors suffer from significant crosstalk between proximate pixels due to light diffraction. Such crosstalk tends to increase as the wavelength of incident light becomes longer and the integration density of image sensor increases.

SUMMARY

Embodiments of the inventive concept provide an image sensor capable of reducing crosstalk. Embodiments of the inventive concept also provide a method of manufacturing an image sensor characterized by reduced crosstalk.

Embodiments of the inventive concept provide a backside-illuminated image sensor capable of reducing crosstalk. Embodiments of the inventive concept also provide a method of manufacturing a backside-illuminated image sensor characterized by reduced crosstalk.

One embodiment of the inventive concept provides an image sensor comprising; a substrate including a first side and an opposing second side through which incident light is received, wherein the substrate is divided into a plurality of pixels, photoelectric converters disposed in the substrate and arranged one-to-one in relation to the plurality of pixels, interlayer dielectric patterns of a first refractive index disposed on the second side and respectively arranged over a corresponding one of the photoelectric converters, and color filters disposed on and respectively arranged over a corresponding one of the interlayer dielectric patterns, wherein adjacent interlayer dielectric patterns are separated by an intervening gap region having a second refractive index different from the first refractive index.

The second refractive index of the gap region may be less than the first refractive index of the interlayer dielectric patterns.

Another embodiment of the inventive concept provides a method of manufacturing an image sensor, comprising; preparing a substrate including a first side and an opposing second side through which incident light is received, forming photoelectric converters in the first side of the substrate, forming multi-layered interconnects and interlayer dielectrics on the first side over the photoelectric converters, forming interlayer dielectric patterns on the second side respectively arranged over a corresponding one of the photoelectric converters, forming color filters in respective arrangement on a corresponding one of the interlayer dielectric patterns, and forming micro-lenses in respective arrangement on a corresponding one of the color filters, wherein forming the interlayer dielectric patterns comprises forming an intervening gap region between adjacent ones of the interlayer dielectric patterns, the gap region having a refractive index less than that of the adjacent ones of the interlayer dielectric patterns.

BRIEF DESCRIPTION OF THE DRAWINGS

The accompanying drawings are included to provide a further understanding of the inventive concept and are incorporated in and constitute a part of this specification. The drawings illustrate example embodiments of the present inventive concept and, together with the description, serve to explain principles of the present inventive concept. In the drawings.

DETAILED DESCRIPTION OF EMBODIMENTS

Figure 1:
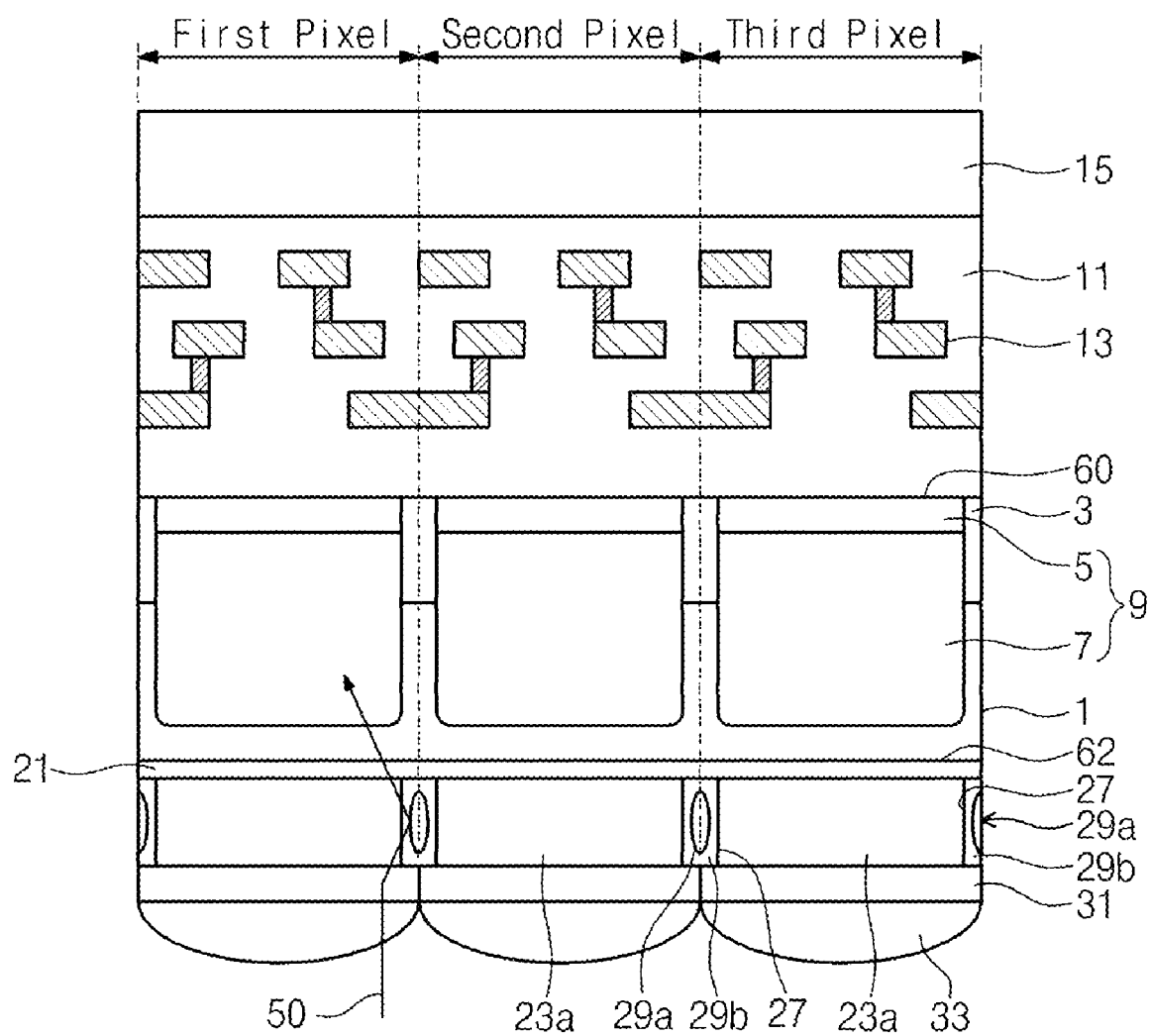
FIG. 1 is a cross-sectional view illustrating a backside-illuminated image sensor according to an embodiment of the inventive concept.

Embodiments of the inventive concept will now be described in some additional detail with reference to the accompanying drawings. The inventive concept may, however, be embodied in different forms and should not be construed as being limited to only the illustrated embodiments. Rather, these embodiments are presented as teaching examples. In the drawings, the thickness(es) and/or relative thickness of certain layers and regions may be exaggerated for clarity. It will be understood that, when a layer is referred to as being "on" another layer or a substrate, it may be "directly on" the layer or substrate, or intervening layers may be present. Throughout the drawings and written description, like reference numbers and labels are used to refer to like or similar elements.

FIG. 1 is a cross-sectional view illustrating a backside-illuminated image sensor according to an embodiment of the inventive concept.

Referring to FIG. 1, the backside-illuminated image sensor comprises a semiconductor substrate 1 having a principle front-side 60 and an opposing back-side 62. The semiconductor substrate 1 is illustrated with a first pixel, a second pixel, and a third pixel. Device isolation layers 3 define active regions for respective pixels in the semiconductor substrate 1. A photoelectric converter 9 is formed for each of the pixels in the semiconductor substrate 1. The photoelectric converter 9 may include at least two impurity-doped layers 5 and 7. The impurity-doped layers 5 and 7 include a first impurity-doped layer 5 doped with impurities of a first type and a second impurity-doped layer 7 doped with impurities of a second type. A plurality of transistors (not shown) is formed on one side of the upper surface of the photoelectric converter 9. A plurality of interconnect layers 13 and a plurality of interlayer dielectrics 11 are provided on the front-side 60 of the semiconductor substrate 1. A supporting substrate 15 is then provided on the interlayer dielectric 11 to facilitate back-side processing.

An anti-reflective layer 21 is provided on the back-side 62 of the semiconductor substrate 1. Back-side interlayer dielectric patterns 23a are provided on the lower surface of the anti-reflective layer 21 at the position corresponding to each of the pixels. Gap regions 27 are provided between adjacent back-side interlayer dielectric patterns 23a, and a gap insulating layer pattern 29b including a void 29a formed therein is provided in each of the gap regions 27. The back-side interlayer dielectric patterns 23a and the gap insulating layer patterns 29b may be, for example, silicon oxide layers. Color filters 31 are provided below the back-side interlayer dielectric patterns 23a. The color filters 31 may be, for example, red, green, and blue color filters. The gap insulating layer patterns 29b be in contact with the upper surfaces of the color filters 31 and separate the back-side interlayer dielectric patterns 23a into each pixel. Microlenses 33 are provided on the lower surfaces of the color filters 31.

In the backside-illuminated image sensor illustrated in FIG. 1, the void 29a provided above the edge of each color filter 31 reflects incident light 50 and prevents (or dramatically reduces) the occurrence of crosstalk due to the diffraction of incident light 50. The void 29a is essentially an empty space formed within the material of the gap insulating layer patterns 29b. The void 29a may be filled with air or other gases, or it may be a vacuum space. The refractive index of the void 29a is preferably 1 or "about 1".

When the gap insulating layer pattern 29b and the back-side interlayer dielectric pattern 23a next to the void 29a are formed from a silicon oxide material, the gap insulating layer pattern 29b and the back-side interlayer dielectric pattern 23a will exhibit a refractive index of, (e.g.) 1.47. Therefore, there is a difference in refractive index between the void 29a and the layers 23a and 29b in the vicinity of the void 29a which result in significant reflection of "void-incident light" 50. Therefore, as illustrated in FIG. 1, the void-incident light 50 is reflected back into the color filter 31 associated with an "incident pixel" and is not allowed to pass into an "adjacent pixel".

FIGS. 2 to 8 are related cross-sectional views illustrating a process of manufacturing the backside-illuminated image sensor illustrated in FIG. 1.

Figure 2:
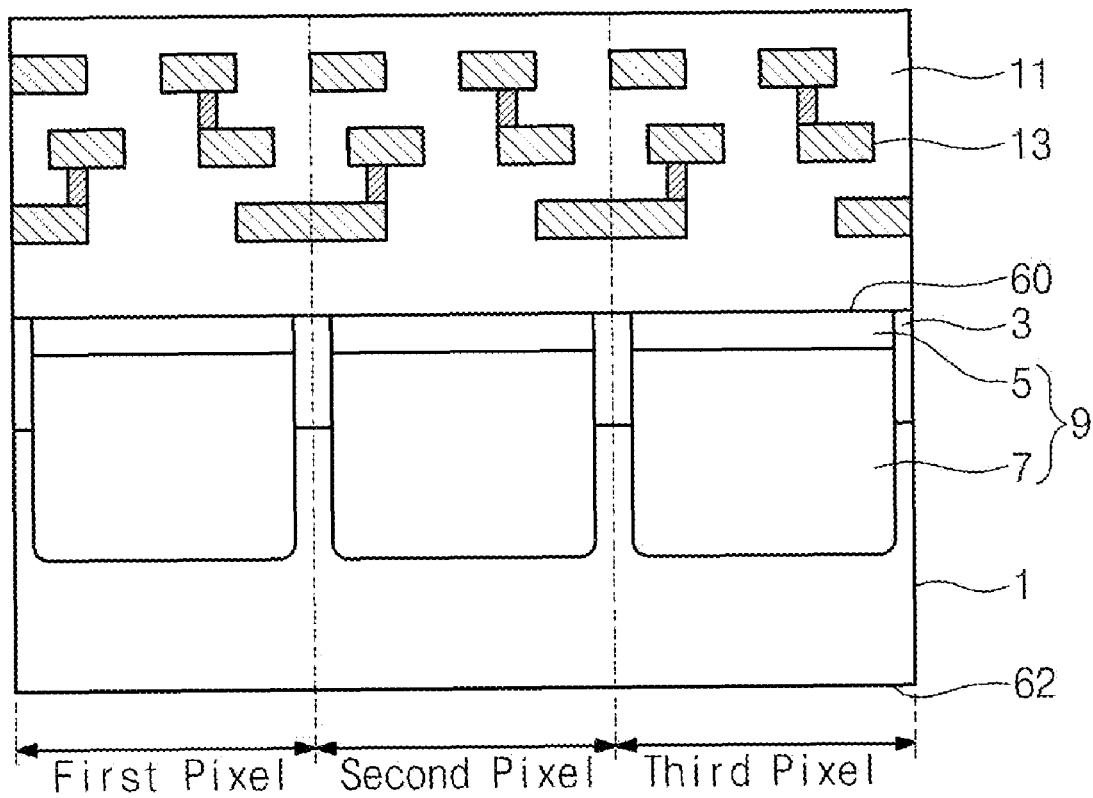
FIGS. 2 to 8 are cross-sectional views illustrating a process of manufacturing the backside-illuminated image sensor illustrated in FIG. 1.

First, referring to FIG. 2, a first-type impurity is doped into the semiconductor substrate 1 having the front-side 60 and the back-side 62 defined therein to form wells (not shown). The device isolation layers 3 are formed in the semiconductor substrate 1 to define the active regions of the pixels. The device isolation layers 3 may be formed by, for example, a general shallow trench isolation method. At least two ion implantation processes are performed in each of the pixels defined by the device isolation layers 3 to form a first impurity-doped layer 5 and a second impurity-doped layer 7, thereby forming the photoelectric converter 9. For example, arsenic may be implanted with a dose of about $1 \times 10^{12}$ atoms/$cm^2$ to form the second impurity-doped layer 7, and boron-fluoride ($BF_2$) may be implanted with a dose of about $1 \times 10^{13}$ atoms/$cm^2$ to form the first impurity-doped layer 5. Although not illustrated in the drawings, after the photoelectric converter 9 is formed, for example, a transfer transistor for transporting charge, a reset transistor, a selection transistor, and an access transistor may be formed. Then, a plurality of interconnect layers 13 and the interlayer dielectrics 11 are formed on the front-side 60 of the semiconductor substrate 1.

Figure 3:
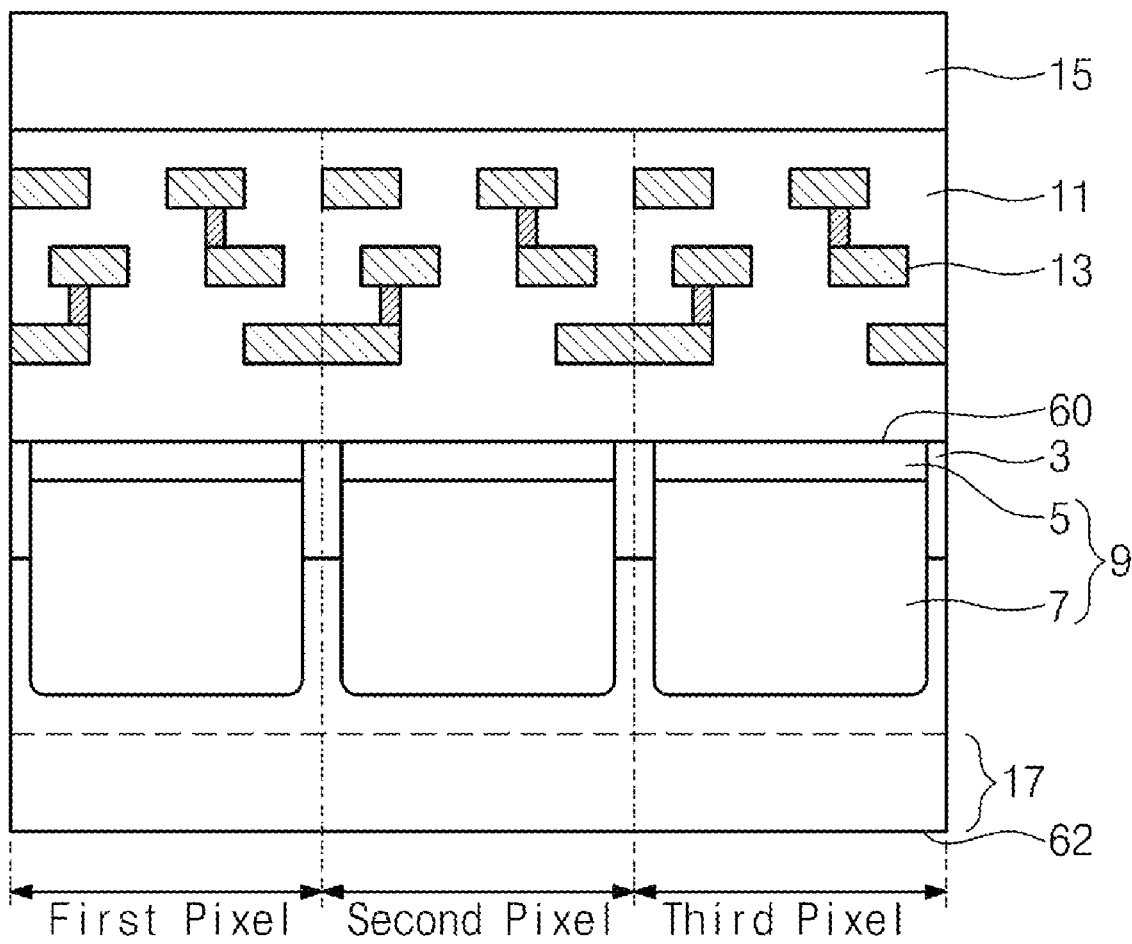

Referring to FIG. 3, the supporting substrate 15 is adhered to the interlayer dielectrics 11 of the semiconductor substrate 1. The supporting substrate 15 may be directly provided on the interlayer dielectrics 11 by a plasma process or a heat treatment. Alternatively, the supporting substrate 15 may be provided on the interlayer dielectrics 11 with a glue layer interposed therebetween. A portion 17 of the back-side 62 of the semiconductor substrate 1 is removed in the state that the supporting substrate 15 is adhered. A portion of the back-side 62 may be removed by at least one process selected from mechanical grinding, CMP (chemical mechanical polishing), etch back, and wet etching.

Figure 4:
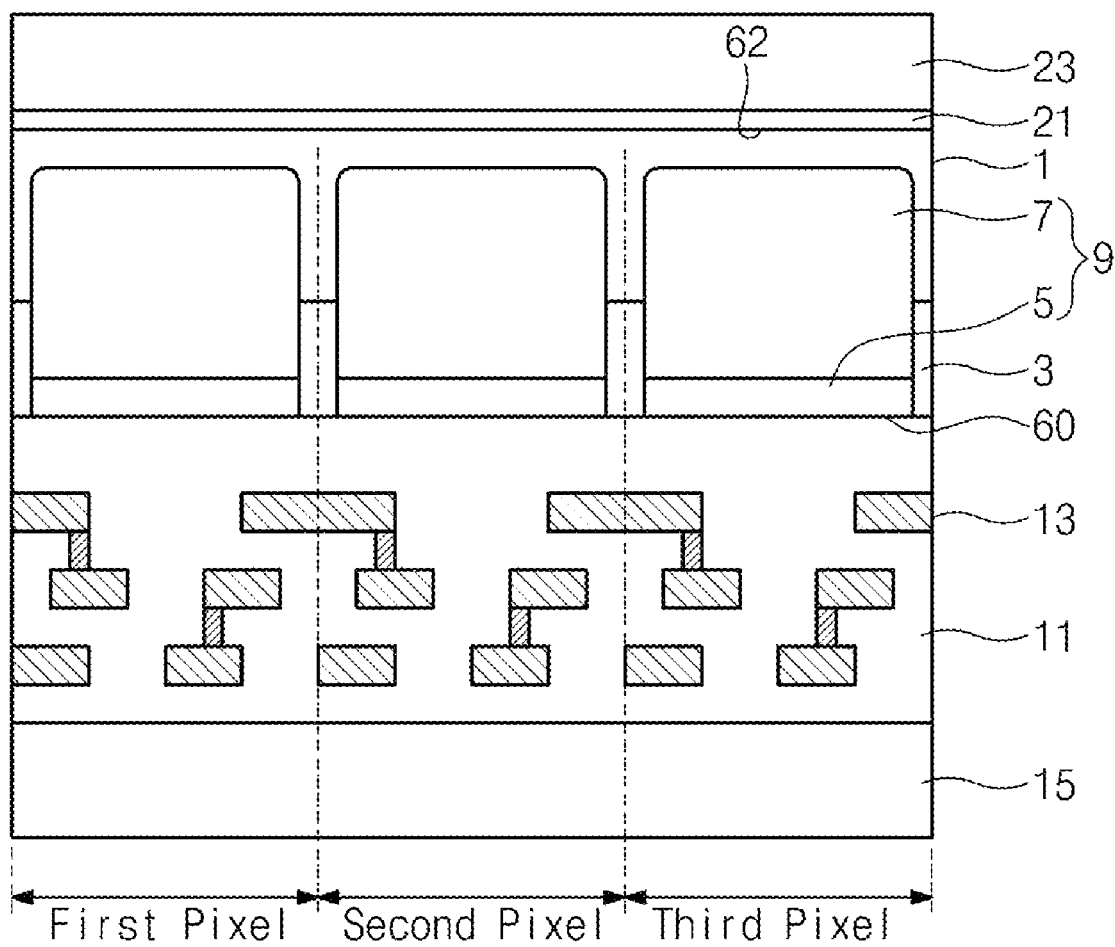

Referring to FIG. 4, the semiconductor substrate 1 in which a portion 17 of the back-side 62 is removed is turned over. Then, the front-side 60 of the semiconductor substrate 1 faces downward, and the back-side 62 thereof faces upward. The anti-reflective layer 21 is formed on the back-side 62. The anti-reflective layer 21 may be formed by a silicon nitride (SiN) layer and/or a silicon oxide layer, for example. At least an upper surface of the anti-reflective layer 21 may be formed from a silicon nitride layer. The back-side interlayer dielectric layer 23 is formed on the anti-reflective layer 21. The back-side interlayer dielectric layer 23 may be a silicon oxide layer formed by a plasma-enhanced chemical vapor deposition (PE-CVD) method at a temperature of about 300 to 400° C., for example.

Figure 5:
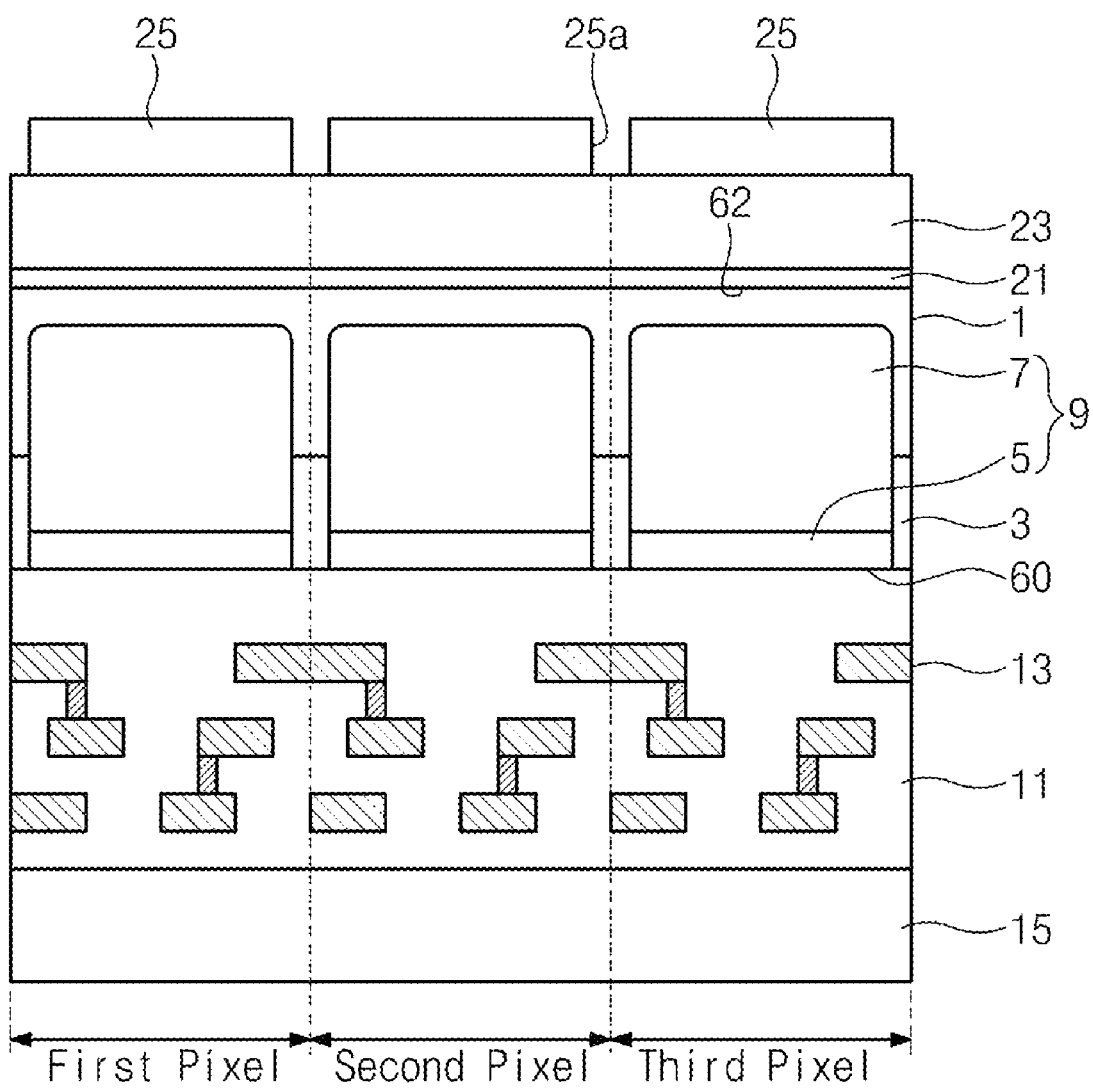

Referring to FIG. 5, a mask pattern 25 is formed on the back-side interlayer dielectric layer 23. The mask pattern 25 includes a material having the etch selectivity with respect to the back-side interlayer dielectric layer 23. For example, the mask pattern 25 may be a photo resist pattern formed by a photolithography process. The mask pattern 25 is formed so as to have openings 25a exposing a portion of the back-side interlayer dielectric layer 23 corresponding to the edge of each pixel.

Figure 6:
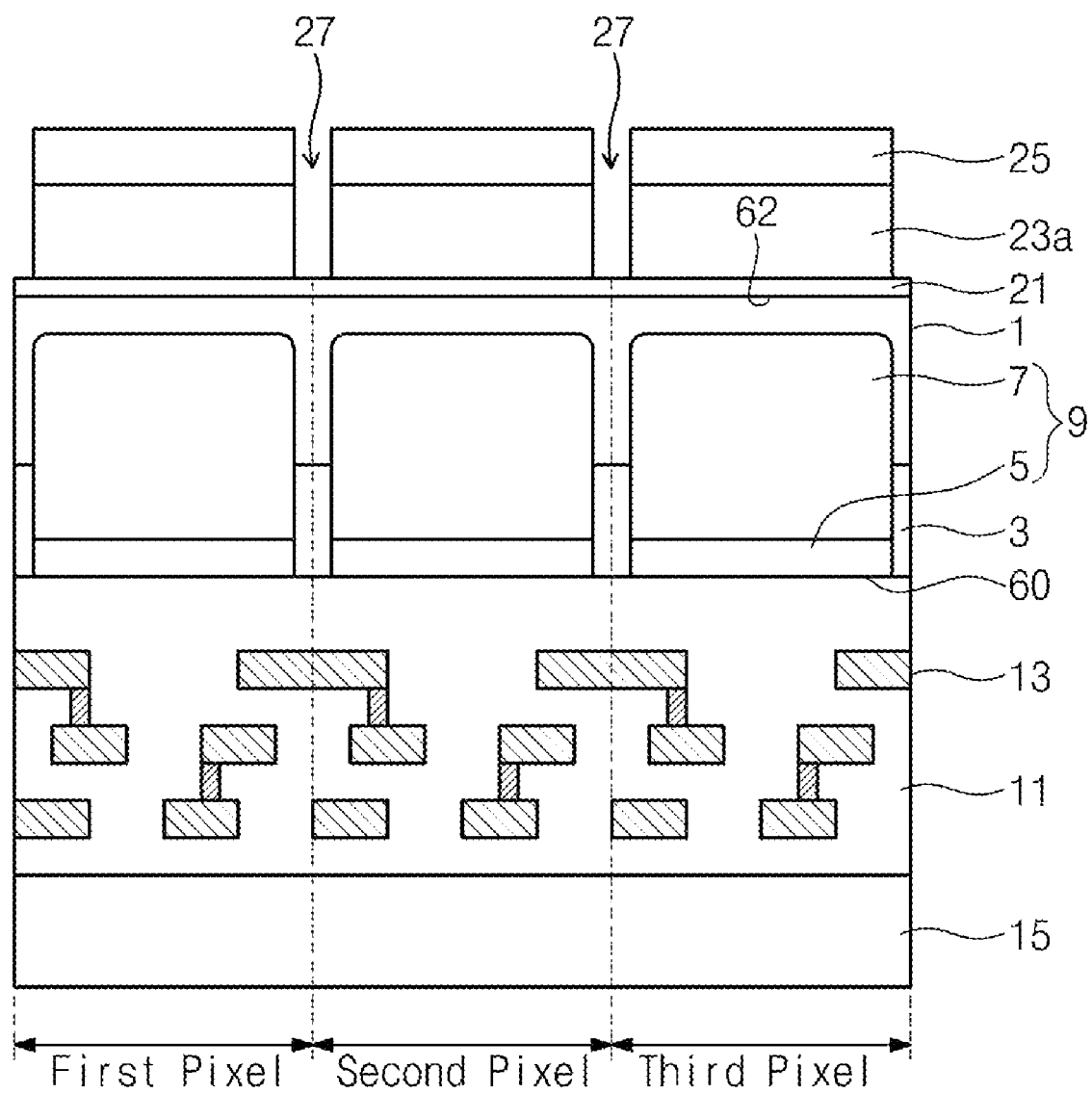

Referring to FIG. 6, anisotropic etching is performed on the back-side interlayer dielectric layer 23 partially exposed through the openings 25a using the mask pattern 25 as an etching mask to form the gap regions 27 exposing the anti-reflective layer 21 at the edge of each pixel. In this case, the anti-reflective layer 21 may serve as an etch stopper. The anisotropic etching may be performed using, for example, gas containing fluorine, such as $CF_4$ or $CHF_3$.

Figure 7:
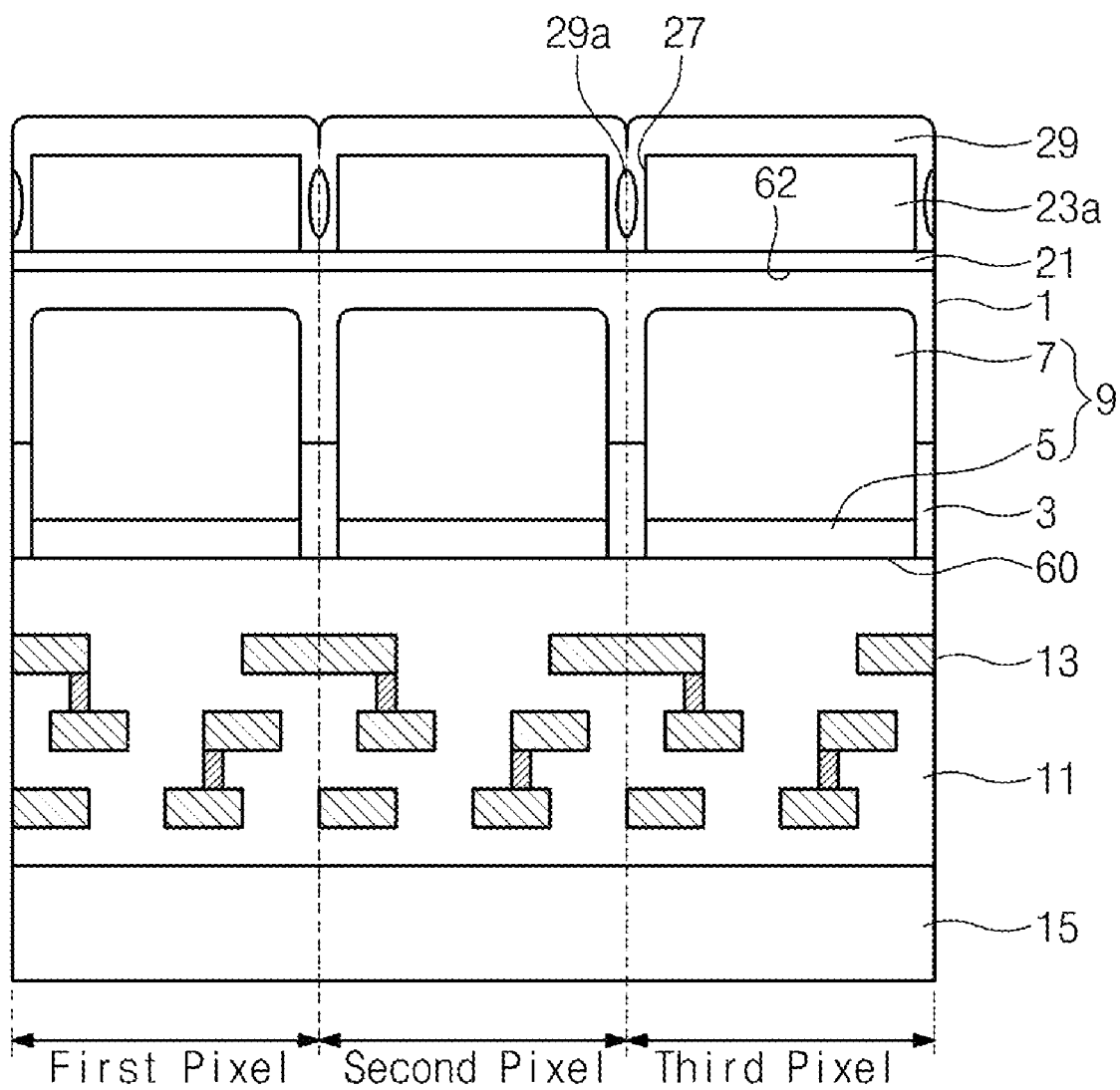

Referring to FIG. 7, when the gap regions 27 are formed, the mask pattern 25 is removed. When the mask pattern 25 is a photo resist pattern, the mask pattern 25 may be removed by, for example, an ashing process using oxygen supplied. After the mask pattern 25 is removed, a gap region insulating layer 29 is formed on the entire back-side 62 of the semiconductor substrate 1. The gap region insulating layer 29 is formed by a method having a very low step coverage characteristic, and the void 29a is formed in each of the gap regions 27. The gap region insulating layer 29 may be a silicon oxide layer formed by a plasma-enhanced chemical vapor deposition (PE-CVD) method at a temperature of about 300 to 400° C., for example.

Figure 8:
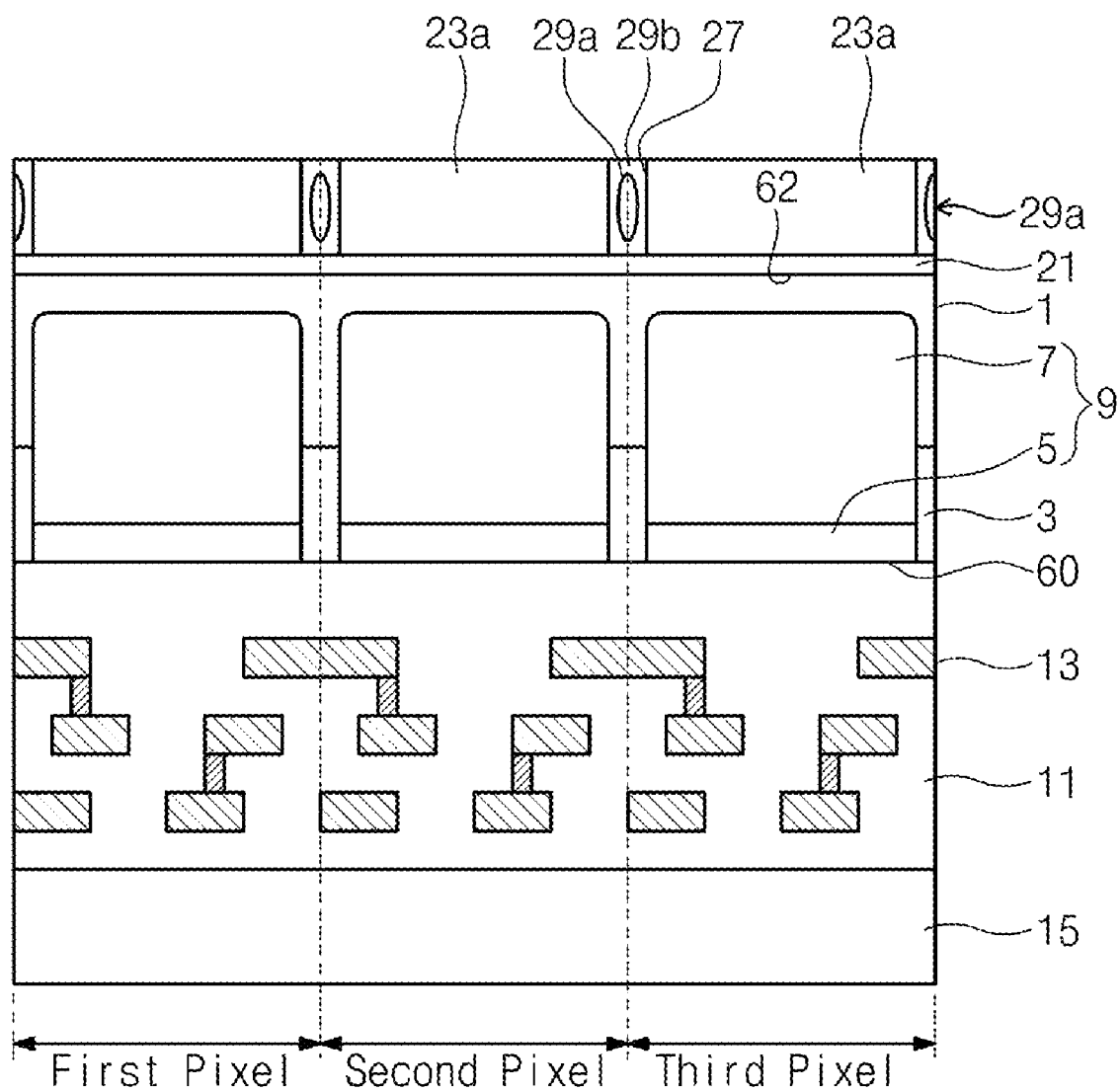

Referring to FIG. 8, a planarizing etching process is performed on the gap region insulating layer 29 to remove the gap region insulating layer 29 on the back-side interlayer dielectric patterns 23a and to make the gap insulating layer pattern 29b including the void 29a remain in each of the gap regions 27 between the back-side interlayer dielectric patterns 23a. The upper surfaces of the gap insulating layer pattern 29b and the back-side interlayer dielectric patterns 23a are planarized by the planarizing etching process. The planarizing etching process may be, for example, a chemical mechanical polishing process.

Then, referring to FIG. 1 again, the color filters 31 are formed on the back-side interlayer dielectric pattern 23a. The color filter 31 may be formed by coating a photo resist including a dye and performing baking, exposure, and development on the coated photo resist. The micro-lens 33 is formed on the color filter 31. The micro-lens 33 may be formed by forming a photo resist pattern including a transparent acrylic resin using photolithography and applying heat to reflow the photo resist pattern.

At this point, the semiconductor substrate 1 subjected to the above-mentioned processes may be turned back over to yield a backside-illuminated image sensor having the structure as FIG. 1.

Figure 9:
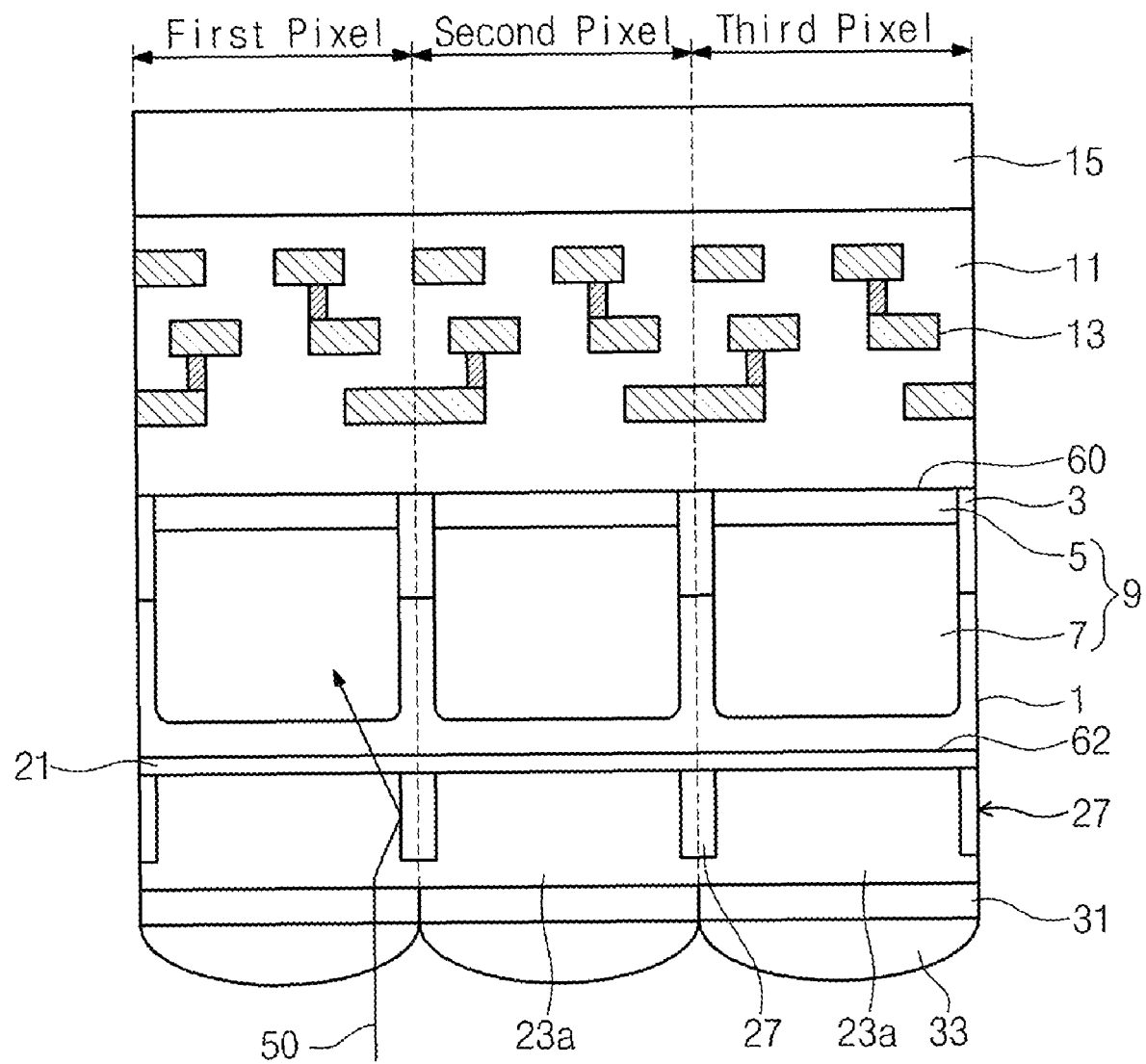
FIG. 9 is a cross-sectional view illustrating a backside-illuminated image sensor according to another embodiment of the inventive concept.
Figure 10:
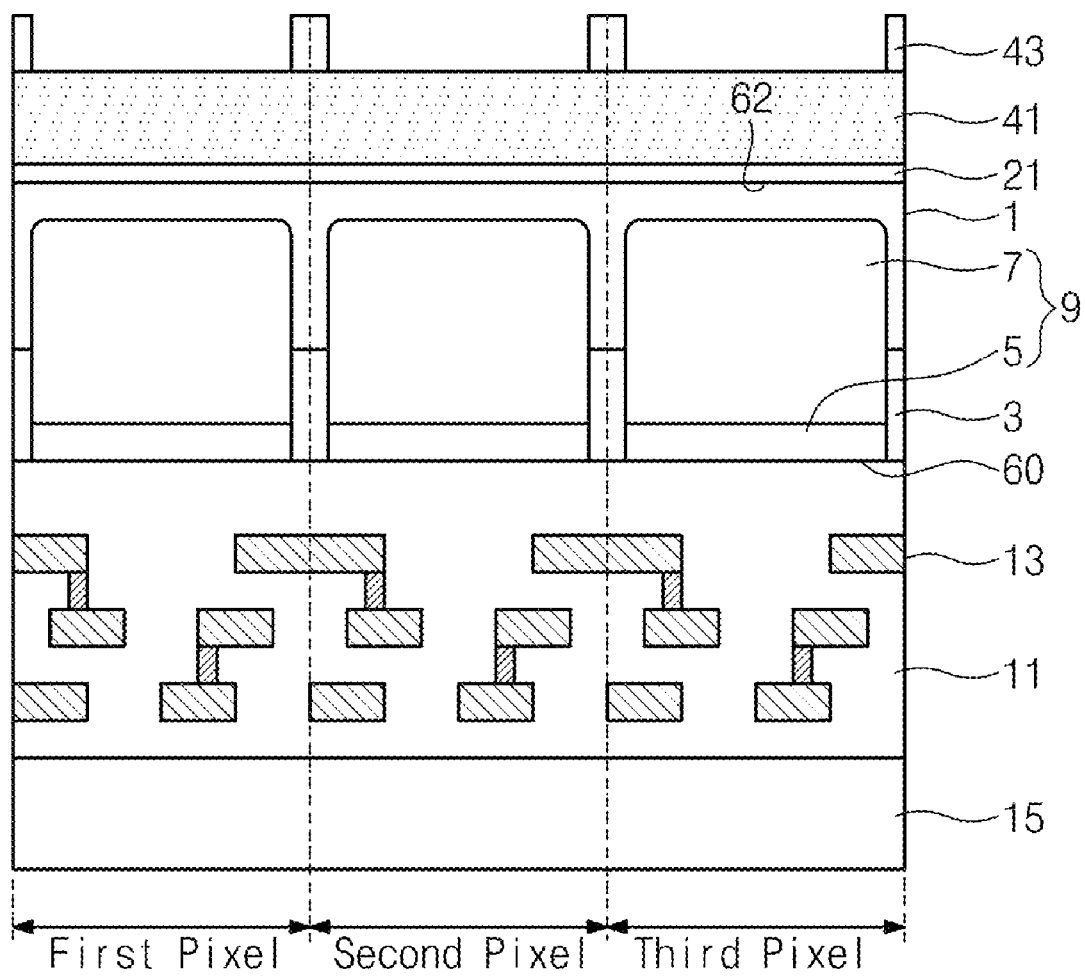
FIGS. 10 to 13 are cross-sectional views sequentially illustrating a process of manufacturing the backside-illuminated image sensor illustrated in FIG. 9.

FIG. 9 is a cross-sectional view illustrating a backside-illuminated image sensor according to another embodiment of the inventive concept.

Referring to FIG. 9, in the backside-illuminated image sensor according to this embodiment, the structure on the anti-reflective layer 21 are the same as that illustrated in FIG. 1. The back-side interlayer dielectric patterns 23a are provided on the lower surface of the anti-reflective layer 21. The lower surfaces of the back-side interlayer dielectric patterns 23a are formed such that they are flat and in contact with each other at the boundaries between the pixels, but the upper surfaces of the back-side interlayer dielectric patterns 23a are separated from each other by the gap regions 27 located at the edge of each pixel. The gap insulating layer pattern 29b illustrated in FIG. 1 is not provided in the gap region 27, and the gap region 27 is empty. The color filter 31 is provided on the lower surface of the back-side interlayer dielectric 23a in each pixel, and the micro-lens 33 is provided on the lower surface of the color filter 31.

In the backside-illuminated image sensor having the structure illustrated in FIG. 9, the gap region 27 provided above the edge of the color filter 31 may reflect the incident light 50 to prevent the occurrence of crosstalk due to the diffraction of the light 50. The gap region 27 is an empty space. The gap region 27 may be filled with air or other gases, or it may be a vacuum space. The refractive index of the gap region 27 is preferably 1 or about 1. When the back-side interlayer dielectric pattern 23a next to the gap region 27 may be formed from a silicon oxide layer and the back-side interlayer dielectric pattern 23a may have a refractive index of (e.g.) 1.47. Therefore, there is a difference in refractive index between the gap region 27 and the layer 29b in the vicinity of the gap region 27, which causes the reflection of the incident light 50. Therefore, as illustrated in FIG. 9, when the light 50 is diffracted in the color filter 31 of a pixel and is incident on an adjacent pixel, the light 50 is reflected from the gap region 27 and is then incident on the pixel.

FIGS. 10 to 13 are cross-sectional views illustrating a process of manufacturing the backside-illuminated image sensor illustrated in FIG. 9.

First, as in FIG. 4, the anti-reflective layer 21 is formed on the back-side 62 of the semiconductor substrate 1. Then, referring to FIG. 10, a sacrificial layer 41 is formed on the anti-reflective layer 21. The sacrificial layer 41 may include, for example, a thermally decomposable polymer or silicon germanium. The thermally decomposable polymer may be, for example, polynorbornene or a copolymer of butylnorbornene and triethoxysilyl norbornene. A mask pattern 43 is formed on the sacrificial layer 41. The mask pattern 43 may be, for example, a photo resist pattern, and is formed such that it covers the edge of each pixel and a portion thereof has a predetermined width.

Figure 11:
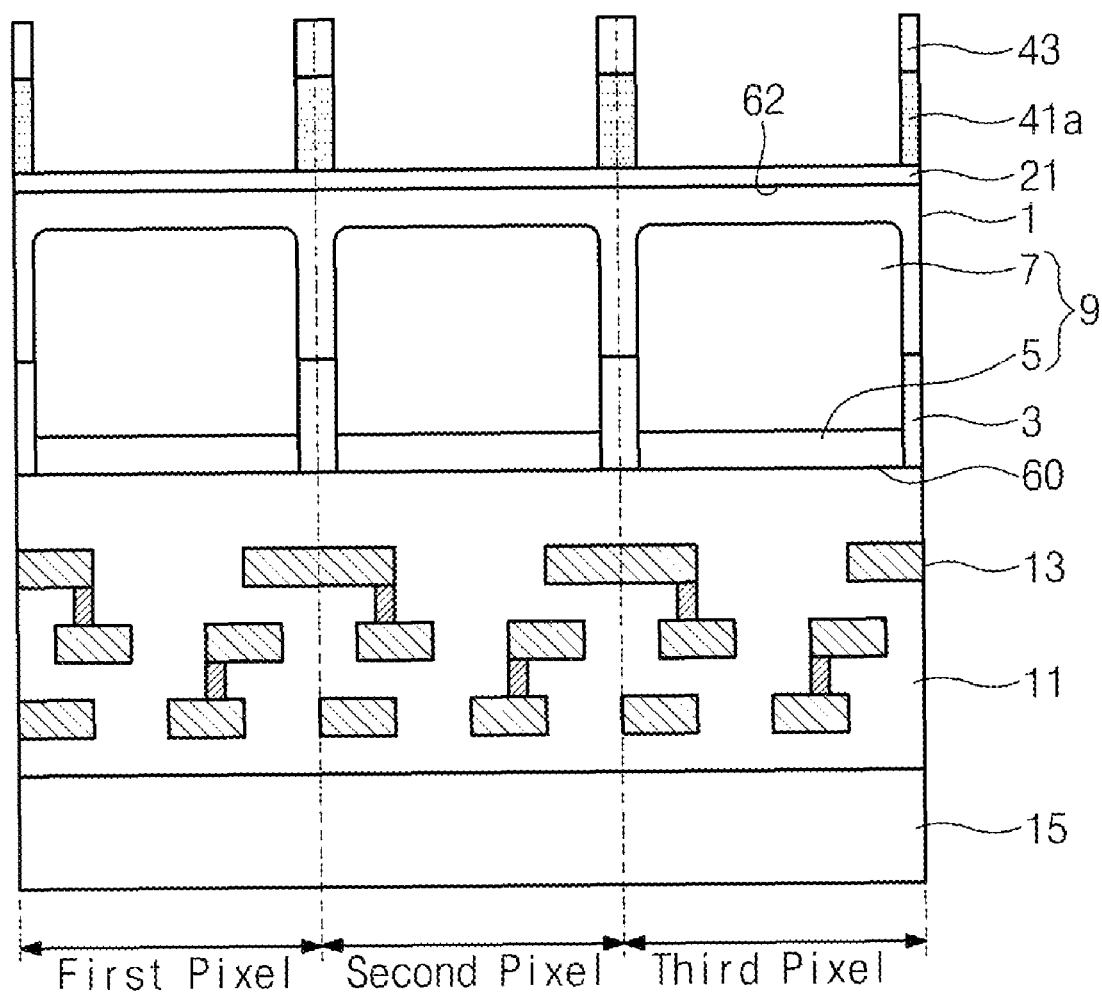

Referring to FIG. 11, an anisotropic etching process is performed on the sacrificial layer 41 using the mask pattern 43 as an etching mask. In this way, the anti-reflective layer 21 is exposed, and a sacrificial layer pattern 41a is formed below the mask pattern 43. In the anisotropic etching process, the anti-reflective layer 21 may serve as an etch stop layer.

Figure 12:
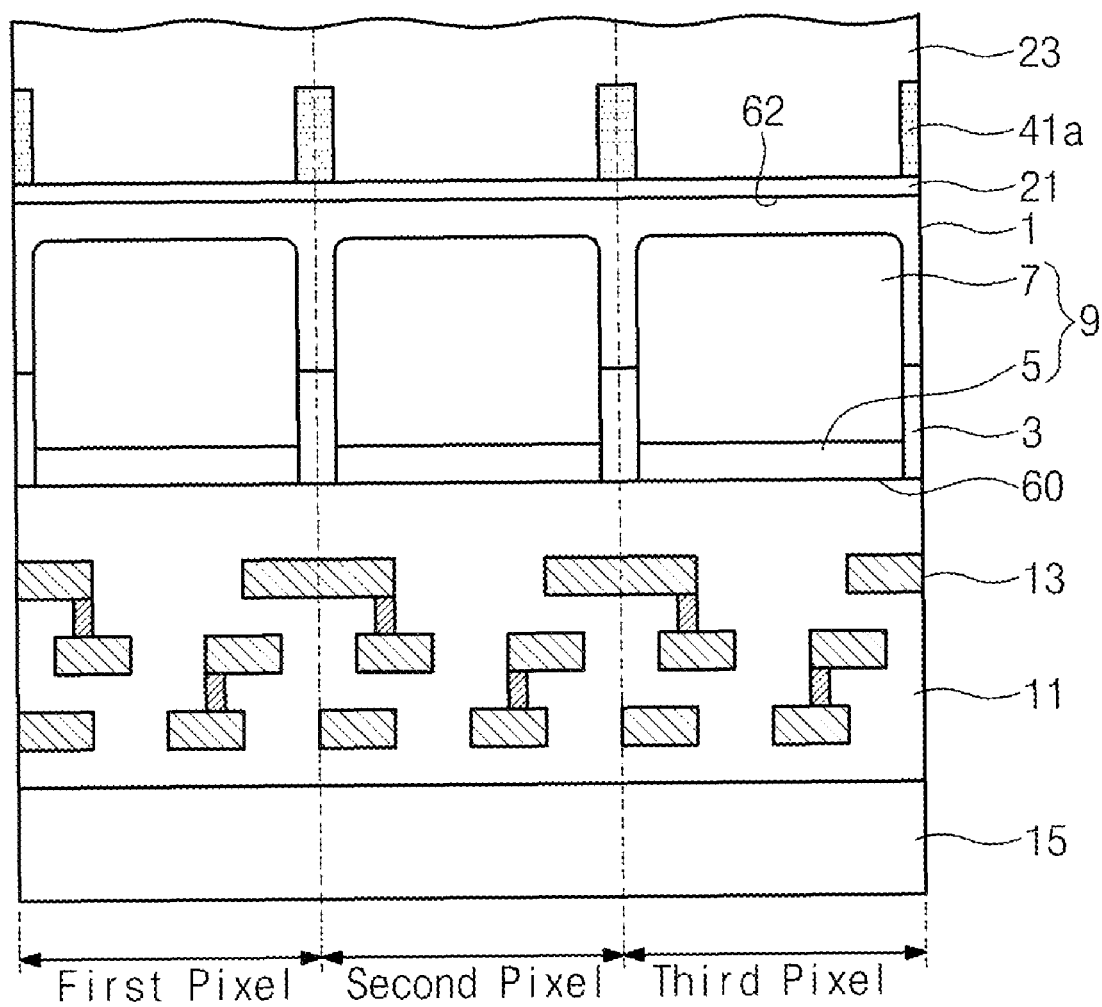

Referring to FIG. 12, the mask pattern 43 is removed. After the mask pattern 43 is removed, the back-side interlayer dielectric 23 is formed on the entire back-side 62 of the semiconductor substrate 1 having the sacrificial layer pattern 41a formed thereon. The back-side interlayer dielectric 23 may be a silicon oxide layer formed by, for example, a plasma-enhanced chemical vapor deposition (PE-CVD) method.

Figure 13:
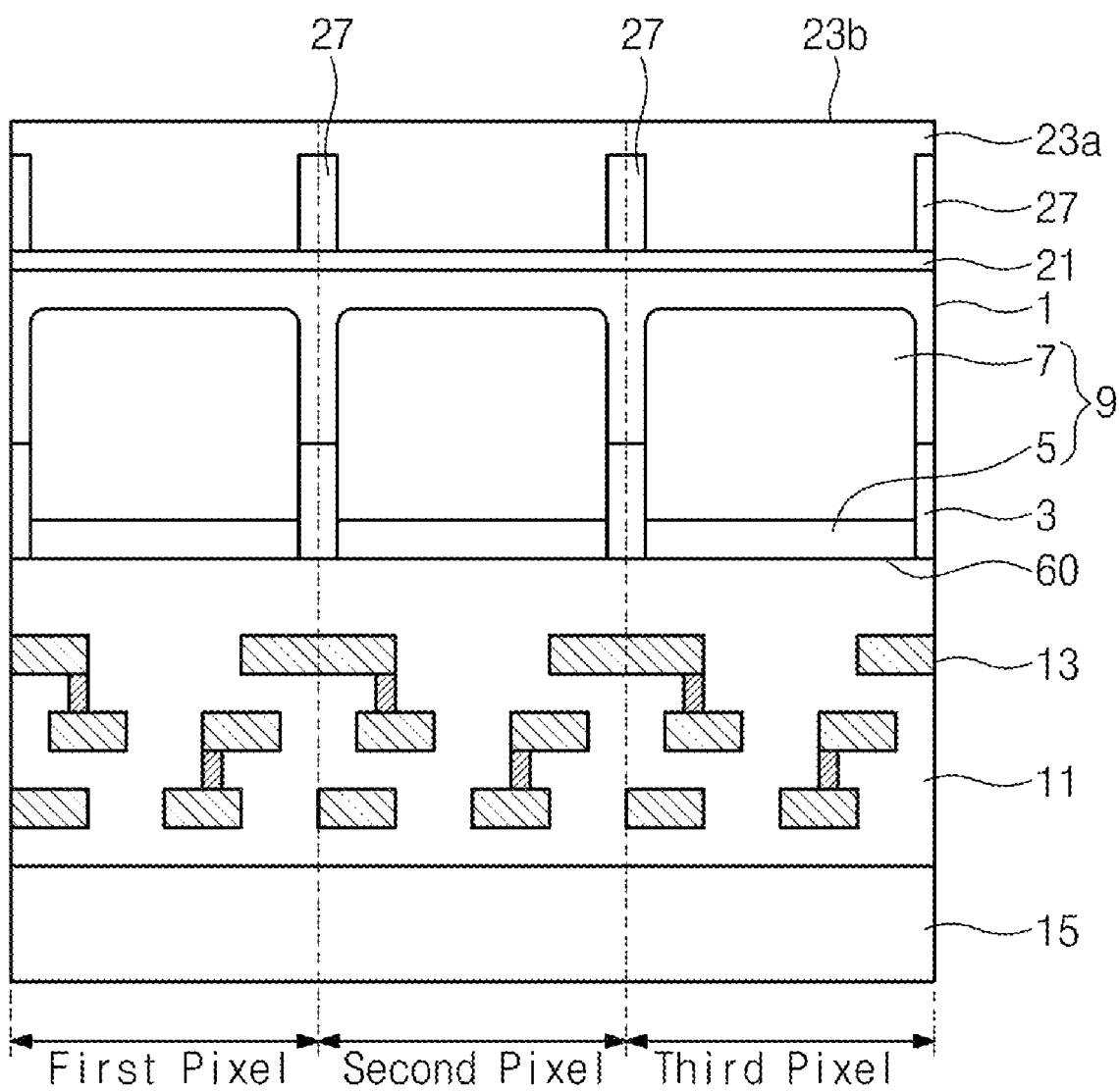

Referring to FIG. 13, a planarizing etching process is performed on the upper surface of the back-side interlayer dielectric 23 to remove a portion of the upper surface and to planarize the upper surface. Then, the sacrificial layer pattern 41a is removed. When the sacrificial layer pattern 41a is formed of a thermally decomposable polymer, such as polynorbornene or a copolymer of butylnorbornene and triethoxysilyl norbornene, the sacrificial layer pattern 41a may be removed by a heat treatment at a temperature ranging from about 300° C. to 450° C. The thermally decomposable polymer is decomposed by the heat treatment and the gap regions 27 are formed. For example, gas generated by the decomposition of the thermally decomposable polymer may be exhausted to the outside through fine gaps or other openings (not shown) in the back-side interlayer dielectric 23. Alternatively, when the sacrificial layer pattern 41a is formed of silicon germanium, an opening may be formed in a predetermined region (not shown) to expose the sacrificial layer pattern 41a, and wet etching is selectively performed using, for example, a mixed solution of ammonium hydroxide, hydrogen peroxide, and water to remove the sacrificial layer pattern 41a. In this way, the gap regions 27 may be formed.

Then, referring to FIG. 9 again, the color filters 31 are formed on the back-side interlayer dielectric patterns 23a. The color filter 31 may be formed by coating a photo resist including a dye and performing baking, exposure, and development on the coated photo resist. The micro-lens 33 is formed on the color filter 31. The micro-lens 33 may be formed by forming a photo resist pattern including a transparent acrylic resin using photolithography and applying heat to reflow the photo resist pattern.

At this point, the semiconductor substrate 1 subjected to the above-mentioned processes may be turned back over to yield a backside-illuminated image sensor having the structure as FIG. 9.

In a backside-illuminated image sensor and a method of manufacturing same according to embodiments of the inventive concept, the back-side interlayer dielectric patterns are formed between the back-side of the semiconductor substrate on which light is incident and color filters provided below the back-side, and empty spaces (or voids filled with air or other gases, or vacuum filled voids), such as gap regions or voids, are formed in the back-side interlayer dielectric patterns at the boundaries between the color filters. Light is reflected by the difference between the refractive index of the empty space and the refractive index of the back-side interlayer dielectric in the vicinity of the empty space. That is, when light is incident on the photoelectric converter of an adjacent pixel through the color filter of a certain pixel and the back-side interlayer dielectric pattern provided below the color filter, the light is reflected by the empty space (i.e., a gap region or void) provided in the back-side interlayer dielectric pattern at a position above the boundary between the color filters, that is, above the edge of the color filter. This prevents the light from passing to adjacent pixels. Therefore, it is possible to prevent or greatly reduce crosstalk.

Although the present inventive concept has been described in connection with the embodiment of the present inventive concept illustrated in the accompanying drawings, it is not limited thereto. It will be apparent to those skilled in the art that various substitutions, modifications and changes may be thereto without departing from the scope of the inventive concept.

What is claimed is:

1. An image sensor comprising:
a interconnect layer;
micro-lenses disposed over the interconnect layer;
photoelectric converters disposed between the interconnect layer and the micro-lenses in a vertical direction, the photoelectric converters arranged to be corresponding to each of the micro-lenses; and
interlayer dielectric patterns disposed between the micro-lenses and the photoelectric converters in the vertical direction, the interlayer dielectric patterns having a first refractive index and arranged to be corresponding to each of the photoelectric converters;
wherein adjacent interlayer dielectric patterns are horizontally separated by an intervening gap region having a second refractive index different from the first refractive index.

2. An image sensor comprising:
a substrate including a first side and an opposing second side through which incident light is received, wherein the substrate is divided into a plurality of pixels;
photoelectric converters disposed in the substrate and arranged one-to-one in relation to the plurality of pixels;
interlayer dielectric patterns of a first refractive index disposed on the second side and respectively arranged over a corresponding one of the photoelectric converters, wherein the interlayer dielectric patterns are spaced apart from each other to define respective gap regions there between, and wherein the gap regions are aligned between respective adjacent photoelectric converters;
color filters disposed on and respectively arranged over a corresponding one of the interlayer dielectric patterns; and
gap insulating layer patterns located within the respective gap regions defined between the interlayer dielectric patterns,
wherein each of the gap insulating layer patterns includes a void formed therein.

3. The image sensor of claim 2, wherein a second refractive index of the void is less than the first refractive index of the interlayer dielectric patterns.

4. The image sensor of claim 3, wherein the first refractive index is about 1.47 and the second refractive index is about 1.

5. The image sensor of claim 2, wherein a material of the gap insulating layer patterns has the first refractive index.

6. The image sensor of claim 2, wherein each of the gap insulating layer patterns contacts both of adjacent color filters.

7. The image sensor of claim 2, wherein each gap region exposes a sidewall of a corresponding one of the interlayer dielectric patterns.

8. The image sensor of claim 2, further comprising multi-layered interconnects and interlayer dielectrics formed on the first side.

9. The image sensor of claim 2, further comprising micro-lenses disposed on and respectively arranged over a corresponding one of the color filters.

10. The image sensor of claim 1, wherein a thickness of the interlayer dielectric patterns is the same as a thickness of the gap insulating layer patterns.

11. An image sensor comprising:
a substrate including a first side and an opposing second side through which incident light is received, wherein the substrate is divided into a plurality of pixels;
photoelectric converters disposed in the substrate and arranged one-to-one in relation to the plurality of pixels;
interlayer dielectric patterns of a first refractive index disposed on the second side and respectively arranged over a corresponding one of the photoelectric converters, wherein the interlayer dielectric patterns are spaced apart from each other to define respective gap regions there between, and wherein the gap regions are aligned between respective adjacent photoelectric converters;
color filters disposed on and respectively arranged over a corresponding one of the interlayer dielectric patterns; and
gap insulating layer patterns located within the respective gap regions defined between the interlayer dielectric patterns,
wherein each of the gap insulating layer patterns includes a discontinuity formed therein, the discontinuity having a second refractive index which is less than the first refractive index.

12. The image sensor of claim 11, wherein the discontinuity is a vacuum space.

13. The image sensor of claim 11, wherein the discontinuity is a space filled with at least one gas.

14. The image sensor of claim 11, wherein each gap region exposes a sidewall of a corresponding one of the interlayer dielectric patterns.

15. The image sensor of claim 11, further comprising multi-layered interconnects and interlayer dielectrics formed on the first side.

16. The image sensor of claim 11, further comprising micro-lenses disposed on and respectively arranged over a corresponding one of the color filters.

17. The image sensor of claim 11, wherein a thickness of the interlayer dielectric patterns is the same as a thickness of the gap insulating layer patterns.

* * * * *